United States Patent
Kobayashi

(10) Patent No.: US 7,754,546 B2
(45) Date of Patent: Jul. 13, 2010

(54) SEMICONDUCTOR DEVICE MANUFACTURING METHOD AND SEMICONDUCTOR DEVICE USING THE SAME

(75) Inventor: Yasutaka Kobayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 93 days.

(21) Appl. No.: 11/905,959

(22) Filed: Oct. 5, 2007

(65) Prior Publication Data

US 2008/0096334 A1   Apr. 24, 2008

(30) Foreign Application Priority Data

Oct. 20, 2006   (JP)   ............... 2006-285737
May 21, 2007   (JP)   ............... 2007-134732

(51) Int. Cl.
*H01L 21/00*   (2006.01)
(52) U.S. Cl. ............... 438/157; 438/283; 257/E21.615; 257/E21.7
(58) Field of Classification Search .......... 257/E21.615, 257/E21.7; 438/157, 283
See application file for complete search history.

(56) References Cited

U.S. PATENT DOCUMENTS 6,413,802 B1   7/2002   Hu et al.

2004/0150071 A1   8/2004   Kondo et al.
2005/0202608 A1   9/2005   Beintner
2007/0259501 A1 *  11/2007   Xiong et al. ............... 438/283

FOREIGN PATENT DOCUMENTS

| JP | 2003-163356 | 6/2003 |
|---|---|---|
| JP | 2004088101 | 3/2004 |
| JP | 2004-214413 | 7/2004 |
| JP | 2005-217418 | 8/2005 |
| JP | 2005-268782 | 9/2005 |
| JP | 2006-093215 | 4/2006 |
| WO | WO 2005104238 A1 * | 11/2005 |

* cited by examiner

*Primary Examiner*—Bradley K Smith
*Assistant Examiner*—Marvin Payen
(74) *Attorney, Agent, or Firm*—Rabin & Berdo, PC

(57) ABSTRACT

Including a process for forming a fin 12*a* having a first height and a fin 12*b* having a second height lower than the first height, a process for forming a silicon oxide film on the upper and side faces of each of the fins 12*a* and 12*b*, a process for forming a conductive poly silicon film on the silicon oxide film, a process for forming a gate insulating film 15 and a gate electrode 16 on from the upper face to the side face of each of the fins 12*a* and 12*b* by patterning the silicon oxide film and the poly silicon film, and a process for forming a couple of diffusion regions 14 in two regions clipping a region underneath the gate electrode of each of the fins 12*a* and 12*b*.

According to the present invention, a semiconductor device manufacturing method and a semiconductor device including a fin-type FET having capability of changing the design of the gate width corresponding to an application can be realized.

11 Claims, 6 Drawing Sheets

SEMICONDUCTOR DEVICE MANUFACTURING METHOD AND SEMICONDUCTOR DEVICE USING THE SAME

BACKGROUND OF THE INVENTION

1. Field of the Invention

The present invention relates to a semiconductor device manufacturing method and the semiconductor device using the manufacturing method thereof, especially, a manufacturing method for a semiconductor device having a fin-type Field Effect Transistor (hereinafter referred to as "FET") and the semiconductor device using the manufacturing method thereof.

This is a counterpart of Japanese patent application Serial Number 285737/2006, filed on Oct. 20, 2006, the subject matter of which is incorporated herein by reference.

2. Description of the Related Art

Recently, the fin-type transistors have been proposed as a technology for increasing integration density of transistors such as FET, as described in the following patent documents 1 to 7. The above mentioned fin-type transistor includes the fin-shaped semiconductor layer projecting from the semiconductor substrate and the gate electrode formed so as to bridge from one of the side faces of the above semiconductor layer to the other side face. It is possible that the fin-type FET of the above structure has the driving region of not only the upper face projecting of the semiconductor layer in a fin-shape but also the side face thereof. Consequently, the required driving capability of the fin-type FET can be realized with a smaller area than a planar-type FET.

Additionally, the fin-type FET can be configured to have a structure so as to deplete thoroughly the semiconductor layer surrounded by the gate electrode during operation of the fin-type FET, by reducing the thickness of the semiconductor layer projecting in a fin shape.

As explained before, a fin-type FET technology can be regarded as an effective technology for forming a transistor having a large capability and a high integration density.

Patent document 1: Japanese Patent Laid-open Number 2005-217418
Patent document 2: Japanese Patent Laid-open Number 2003-163356
Patent document 3: Japanese Patent Laid-open Number 2004-88101
Patent document 4: Japanese Patent Laid-open Number 2004-214413
Patent document 5: U.S. Pat. No. 6,413,802
Patent document 6: Japanese Patent Laid-open Number 2005-268782
Patent document 7: Japanese Patent Laid-open Number 2006-93215

SUMMARY OF THE INVENTION

Although the gate length design can be changed corresponding to the application in the fin-type FET of the conventional technology, the gate width design cannot be changed. The reason is that the height of the semiconductor layer projecting in a fin-shape is uniquely determined.

There is a problem that the above limitation to device design caused by the structure becomes a big obstacle to the case of applying the fin-type transistor to a already-designed circuit, or designing a circuit having various device dimensions.

According to one aspect of the present invention, for achieving an object of the present invention, there is provided a semiconductor device manufacturing method including process for forming a first projecting region having a first height, and forming a second projecting region having a second height lower than the first height, a process for forming a first insulating film on the upper and side faces of the first and second projecting regions, respectively, a process for forming a conductive film on the first insulating film, a process for forming a gate insulating film and a gate electrode on from the upper to the lower faces of each of the first and second projecting regions by patterning the first insulating film and the conductive film, and a process for forming a couple of diffusion regions in two regions clipping the region underneath the gate electrode of the first and the second projecting regions, respectively.

Additionally, a semiconductor device according to the present invention is configured to include a semiconductor substrate, a first projecting region having a first height formed on the semiconductor substrate, a first gate insulating film formed on from the upper to the side faces of the first projecting region, a second gate electrode formed on the first gate insulating film, a couple of first diffusion regions formed in two regions clipping the region underneath the first gate electrode of the first projecting region, a second projecting region having a second height lower than the first height formed on the semiconductor substrate, a second insulating film formed on from the upper to the lower face of the second projecting region, a second gate electrode formed on the second gate insulating film, and a couple of second diffusion region formed in two regions clipping the region underneath the second gate electrode of the second projecting region.

According to the present invention, a semiconductor device manufacturing method and a semiconductor device including a fin-type FET having capability of changing the design of the gate width corresponding to an application can be realized.

(b): An A-A cross section of FIG. 1 (*a*).

(c): A B-B cross section of FIG. 1 (*a*).

Figure 2A:
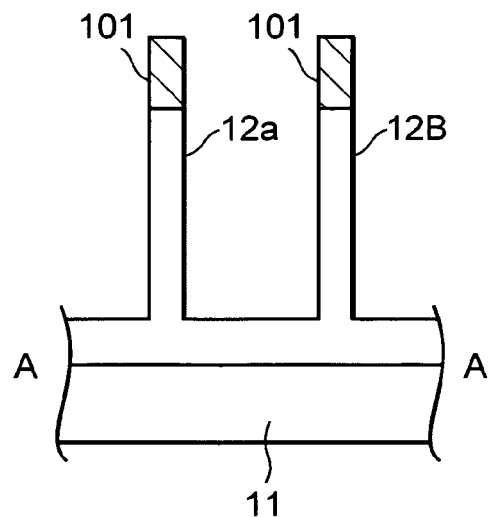
Figure 2B:
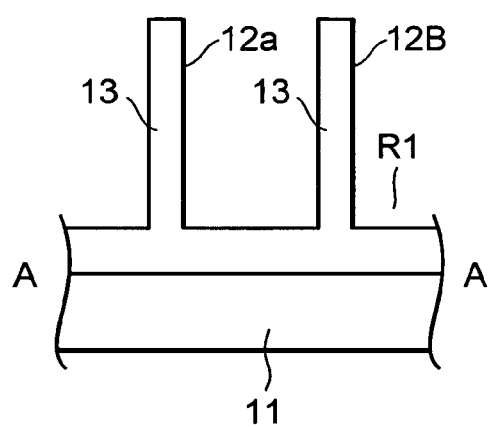
Figure 2C:
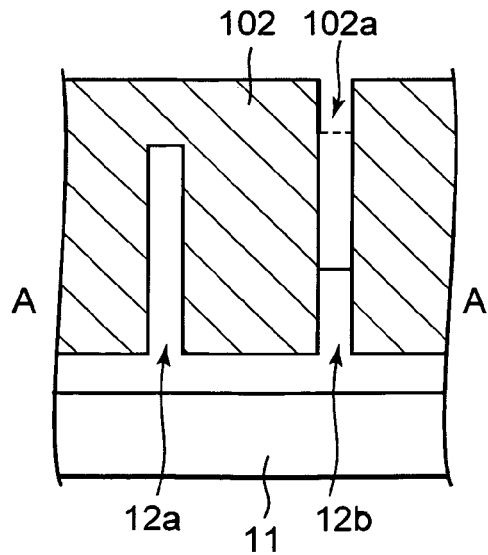

FIG. 2: A process diagram of a manufacturing method for the semiconductor device 1 according to the first embodiment of the present invention. (1)

FIG. 3: A process diagram of a manufacturing method for the semiconductor device 1 according to the first embodiment of the present invention. (2)

FIG. 4 (*a*): A top view showing a general configuration of a semiconductor device 2 according to the second embodiment of the present invention.

(b): An C-C cross section of FIG. 4 (*a*).

(c): A D-D cross section of FIG. 4 (*a*).

Figure 5A:
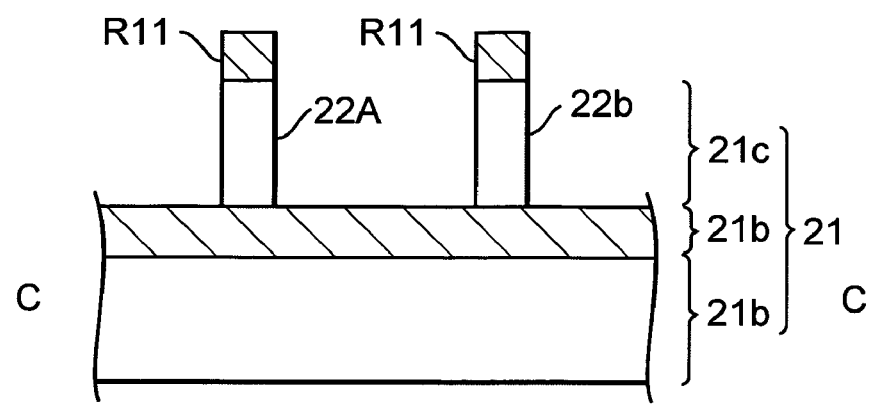
Figure 5B:
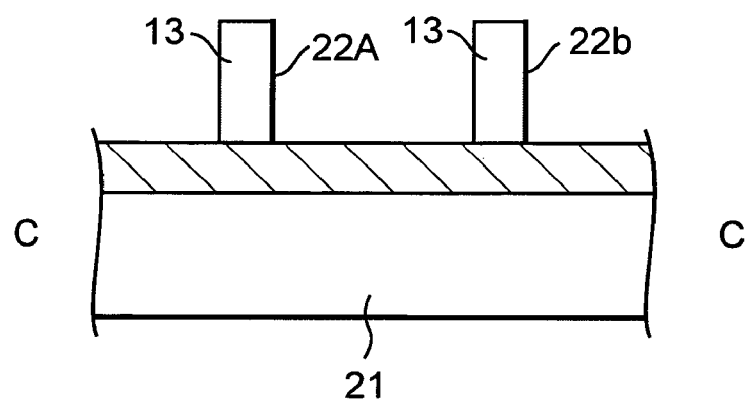

FIG. 5: A process diagram of a manufacturing method for the semiconductor device 2 according to the second embodiment of the present invention. (1)

Figure 6A:
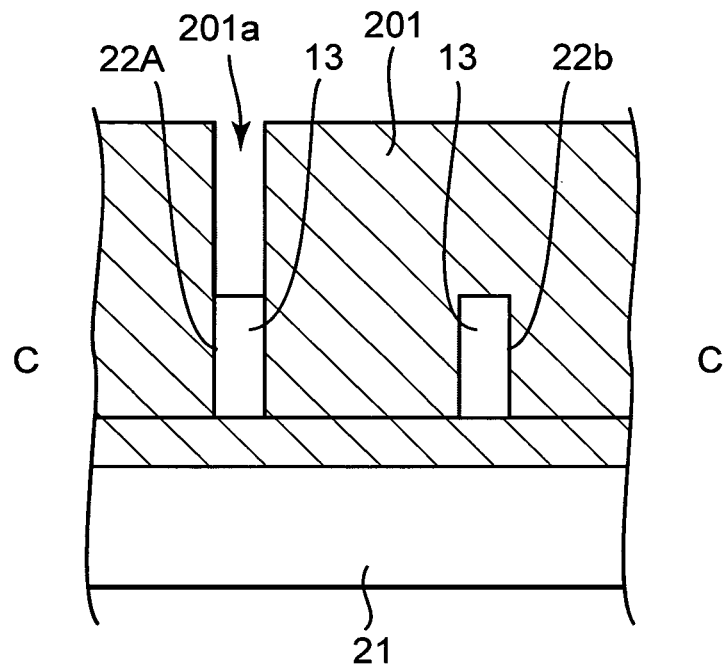

FIG. 6: A process diagram of a manufacturing method for the semiconductor device 2 according to the second embodiment of the present invention. (2)

DETAILED DESCRIPTION OF THE PREFERRED EMBODIMENTS

First Embodiment

First, the first embodiment of the invention will be explained in details referring to the drawings. FIG. 1 (*a*) is an over view showing a general configuration of the semiconductor device 1 according to the present embodiment. FIG. 1 (*b*) is a A-A cross section in FIG. 1 (*a*). FIG. 1 (*c*) is a B-B cross section in FIG. 1 (*a*). In the present embodiment, a semiconductor device 1 having a fin-type FET formed therein will be explained as an example.

General Configuration:

As shown from FIG. 1 (*a*) to FIG. 1 (*c*), a semiconductor device 1 according to the present embodiment is configured to include a semiconductor substrate 11, a fin 12*a* (a first projecting region) formed in the semiconductor substrate 11 and having a first height, a gate insulating film 15 (a first gate insulating film) formed on an upper face to a side face of the fin 12*a* (the first projecting region), a gate electrode 16 (a first gate electrode) formed on the gate insulating film 15 (the first gate insulating film), a couple of diffusion regions 14 (a first diffusion region) formed in two regions straddling a region underneath the gate electrode 16 (a first gate electrode) of the fin 12*a* (the first projecting region), a fin 12*b* (a second projecting region) formed in the semiconductor substrate 11 and having a second height lower than a first height, a gate insulating film 15 (a second insulating film) formed on an upper face to a side face of the fin 12*b* (the second projecting region), a gate electrode 16 (a second gate electrode) formed on the gate insulating film 15 (the second gate insulating film), and a couple of diffusion regions 14 (a second diffusion region) formed in two regions straddling a region underneath the gate electrode 16 (the second gate electrode) of the fin 12*b* (the second projecting region).

The couple of diffusion regions 14 formed on each of the fin 12*a* and the fin 12*b* are a source and a drain.

At the same time, as shown in FIG. 1 (*a*), each of the diffusion regions 14 is electrically connected to a via contact 18, and is connected to interconnections, etc. not shown in the drawings, through the above via contact 18. To clarify the drawings, the via contacts 18 are omitted in FIG. 1(*b*) and FIG. 1(*c*).

Manufacturing Method:

Secondly, a manufacturing method for the semiconductor device 1 having the above mentioned configuration will be explained using the drawings as below. FIG. 2(*a*) from FIG. 2(*c*), and FIG. 3(*b*) are process diagrams showing a manufacturing method for the semiconductor device 1.

In the present manufacturing method, a semiconductor substrate 11 of silicon bulk substrate is prepared, first. Then, an element isolation insulation film (not shown in the drawings) is formed on one of the faces of the semiconductor substrate 11 (hereinafter, referred to as the upper face), by LOCOS (Local Oxidation of Silicon) method or STI (Shallow Trench Isolation) method, etc. Consequently, the upper face of the semiconductor face 11 is sectionalized into plural element forming regions by element isolation films (not shown in the drawings). The region having the element isolation insulating film formed therein is referred to as an element isolation region, too.

Secondly, silicon oxide (SiO2) is deposited using, for example, CVD (Chemical Vapor Deposition) method. During the above process, a thickness of the silicon oxide film can be around 500 to 1000 nm. Subsequently, the silicon oxide film on the semiconductor substrate 11 is patterned, by the existing photolithography technology and etching technology. Consequently, a silicon oxide film 101 is formed in the region located on the semiconductor substrate 11 and having the fins 12*a* and 12B formed in the process described as below.

Subsequently, as shown in FIG. 2, the upper layer of the semiconductor substrate 11 is processed to be the fin 12*a* and the fin 12B by etching the semiconductor substrate 11 into a given depth, using the silicon oxide film 101 as a mask. The heights of the fin 12*a* and the fin 12B can be around 150 nm. It is preferable to use an etching technology having capability of engraving the substrate surface approximately vertically and realizing a sufficient selection ratio to the silicon oxide film 101 such as RIE (Reactive Ion Etching), etc., for engraving the semiconductor substrate 11.

Subsequently, the silicon oxide film 101 used as the mask is removed by the existing etching technology. Secondly, a given impurity ion (for example, Boron ion) is implanted into the fin 12*a* and the fin 12B by the existing ion implantation technology. By the above process, as shown in FIG. 2(*b*), a body region 13 having the adjusted threshold voltage is formed in the fin 12*a* and the fin 12B, respectively. The impurity density of the body region 13 can be around 1-3× $10^{18}/cm^3$ in the above process. The impurity ion can be implanted into the upper layer of the semiconductor substrate 11 except the fin 12*a* or the fin 12B. However, in the case where the impurity ion implantation into the semiconductor substrate 11 except the fin 12*a* or the fin 12B is not preferable, it is preferable to leave masks of photo resists or silicon oxide films, etc. formed in the above region. Furthermore, in the above process, a technology can be used for implantation of a given impurity ion into the semiconductor substrate 11 by rotating the turntable putting the semiconductor substrate 11 on the top surface thereof in a tilting posture from the ion implantation direction (so-called oblique ion implantation). It becomes possible to implant the impurity ions approximately equally by the above process. In the process, the thickness of the body region 13 is around less than 100 nm.

Secondly, by a CVD method, a silicon oxide film 102 is formed to the extent of burying the fin 12*a* and the fin 12B into the whole upper face of the semiconductor substrate 11. Subsequently, an opening 102*a* is formed in the silicon oxide film 102 so as to expose the upper face of the fin 12B by the existing photolithography technology and etching technology. Then, the fin 12B is etched into a given height by etching the fin 12B exposed from the opening 102*a*. Consequently, as shown in FIG. 2(*c*), the fin 12*b* having a height lower than the fin 12*a* is formed. The height of the fin 12B after etching can be around 50 nm. The above etching can be a dry etching, or a wet etching.

As explained before, a fin according to the present embodiment is formed by engraving the upper face of the semiconductor substrate 11. At the same time, the height differential between each of the fins is formed by engraving a fin to be lowered (the fin 12B in the case of the present embodiment) by etching.

Figure 3A:
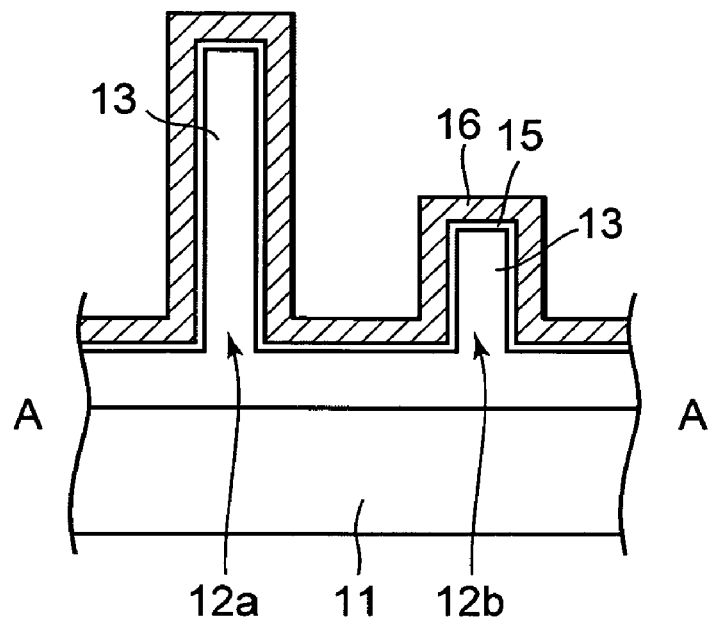

Subsequently, the silicon oxide film 102 used as the mask is removed by existing etching technology. Then, a silicon oxide film having thickness of around 10 nm is formed by thermal oxidation of the upper face of the semiconductor substrate 11 having the fin 12a and the fin 12b formed therein. Subsequently, a conductive poly silicon film is formed on the above formed silicon oxide film by the existing CVD method. Then, the above poly silicon film and the above silicon oxide film are sequentially patterned by the existing photolithography and etching technologies. Consequently, a gate electrode 16 and a gate insulating film 15 located across the fins 12a and 12b are formed on the semiconductor substrate 11, as shown in FIG. 3(a). A top view shape of the gate electrode 16 is shown in FIG. 1 (a). As shown, the gate electrode extends continuously from one of the side faces of the first projecting region, to the upper face of the first projecting region, to the other side face of the first projecting region, across the space separating the first projecting region from the second projecting region, to one of the side faces of the second projecting region, to the upper face of the second projecting region, and to the other side face of the second projecting region, respectively.

Figure 3B:
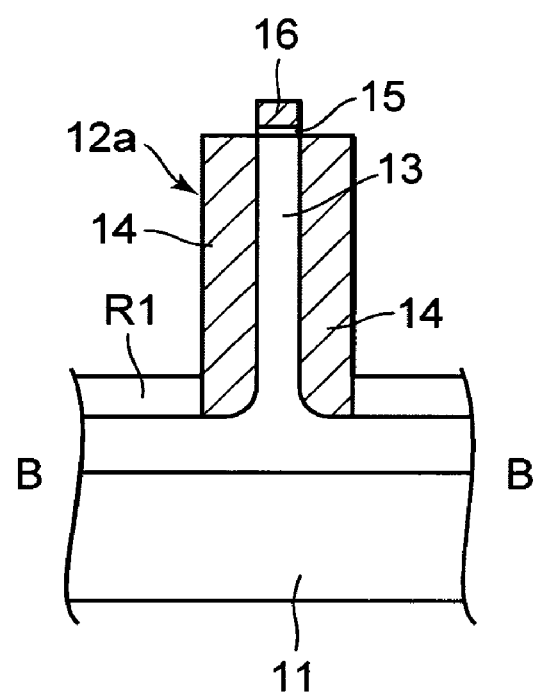

Subsequently, a photo resist R1 is formed in a region covering the regions having no formed fins 12a and 12b in the semiconductor substrate 11 by the existing photolithography. Then, a couple of diffusion regions 14 straddling the body region 13 underneath the gate electrode 16 are formed in the fin 12a and the fin 12b, respectively, by implanting a given impurity ion (for example, phosphorous ion) by the existing ion implantation technology using the photo resist R1 and the gate electrode 16 as masks, as shown in FIG. 3(b). The impurity density of the diffusion regions 14 can be around $1 \times 10^{21}/cm^3$. In the process thereof, a given impurity ion can be implanted into given regions of the fin 12a and the fin 12b by the oblique ion implantation.

Figure 1A:
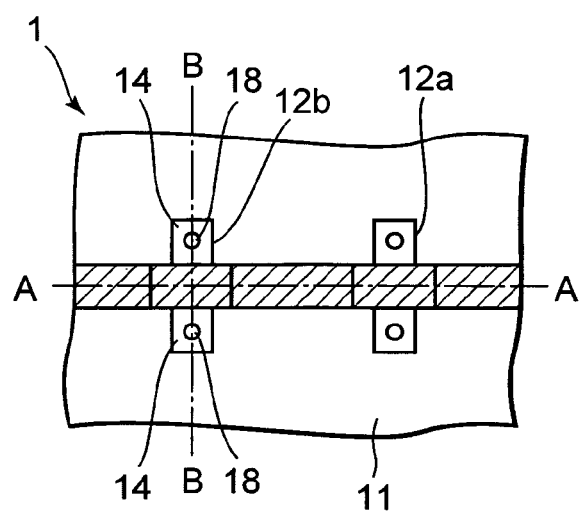
FIG. 1 (*a*): A top view showing a general configuration of a semiconductor device 1 according to the first embodiment of the first invention.
Figure 1B:
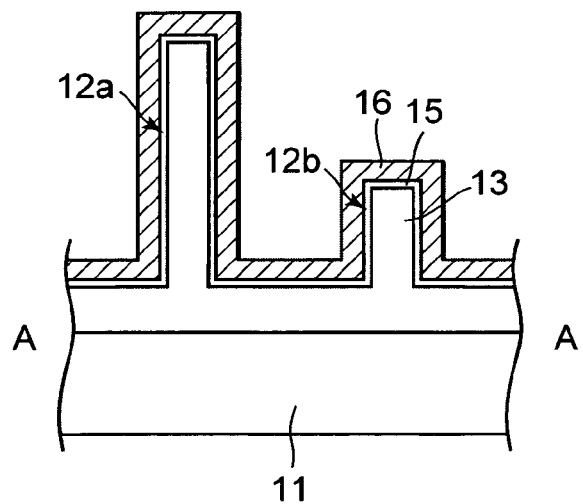
Figure 1C:
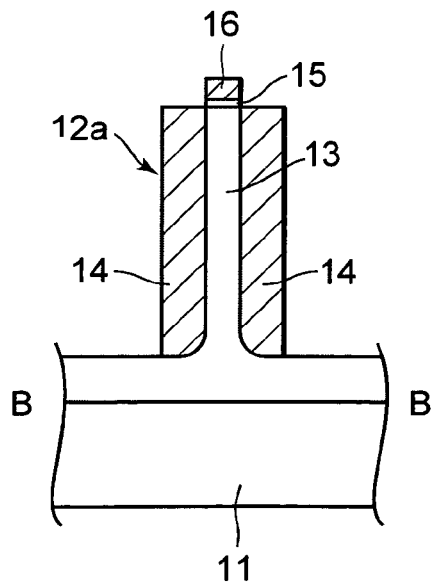

Subsequently, after removing the photo resist R1, the semiconductor device 1 having the configurations shown in from FIG. 1(a) to FIG. 1(c) is formed by forming inter layer insulating films and inter connection layers (including the via contact 18) not shown in the drawings. As shown, the gate electrode can be configured so that it does not cover the diffusion regions. Further, the diffusion regions of each projecting region may be disposed on opposite first and second side faces of the respective projecting regions, and the gate electrode may be disposed on respective third and fourth side faces of the respective projecting regions. The first and second side faces face in a direction perpendicular to the direction in which the third and fourth side faces face, for example.

As explained before, the manufacturing method for the semiconductor device 1 according to the present embodiment is configured to include a process for forming the fin 12a (the first projecting region) having the first height and the fin 12b (the second projecting region) having the second height lower than the first height on the upper face of semiconductor substrate 11, a process for forming the silicon oxide film (the first insulating film) on the upper face and the side face of each of the fin 12a and the fin 12b (the first and second projecting regions), a process for forming the conductive poly silicon film (electric conductor film) on the silicon oxide film (the first insulating film), a process for forming the gate insulating film 15 and the gate electrode 16 on from the upper face and the side face of each of the fin 12a and the fin 12b (the first and the second projecting regions) by patterning the silicon oxide film (the first insulating film) and the poly silicon film (the electric conductor film), and a process for forming a couple of diffusion regions 14 in two regions straddling the region underneath the gate electrode 16 in each of the fin 12a and the fin 12b (the first and the second projecting regions), respectively. The thickness of each of the gate electrode insulating films is 1.5 nm and the gate electrode 16 is around less than 10 nm.

In addition, in the above mentioned processes, the process for forming the fins 12a and 12b (the first and the second projecting regions) includes a process for forming the fin 12a (the first projecting region) having the first height and the fin 12B (the third projecting region) by engraving the upper face of the semiconductor substrate 11 using etching, a process for processing the fin 12B (the third projecting region) into the fin 12b (the second projecting region) by etching the fin 12B (the third projecting region) from the upper face thereof.

According to the present embodiment, the aforementioned configuration enables forming more than two types of fins differing in the height. Consequently, it becomes possible to form a plural of types of fin-type FET differing in transistor-characteristics such as current-voltage characteristics, etc. on the same substrate. In the case where the height of the fin-type FET is formed to be higher than others (corresponding to the fin 12a according to the present embodiment), the effective gate width of the fin-type FET using the above fin becomes larger. Consequently, it becomes possible that the above fin-type FET has a larger current characteristic. Meanwhile, in the case where the height of the fin-type FET is formed to be smaller than others (corresponding to the fin 12b according to the present embodiment), the effective gate width of the fin-type FET using the above fin becomes smaller. Consequently, it becomes possible that the above fin-type FET has a smaller current characteristic.

Additionally, according to the present embodiment, the gate width of each of the fin-type FETs can be controlled by varying the height of the fin. Therefore, even in the case where a plural of fin-type FETs having different transistor characteristics each other are formed on the same substrate, it becomes possible to unify the two-dimensional pattern designs of element-forming region between each of the above fin-type FETs. In other words, it becomes possible to use the same two-dimensional pattern design of element-forming region between the fin-type FETs having different transistor characteristics each other. Consequently, the workload on designing circuit patterns can be reduced to a large extent.

As explained before, according to the present embodiment, it becomes possible to change the design of the gate width limited by the height of the fin, correspondingly to the applications, and then, it becomes possible to apply the fin-type FET to already-designed circuits, and to design circuits having various element dimensions by using the fin-type fin.

In addition, although a bulk substrate is used as the semiconductor substrate 1 according to the present embodiment, various types of substrates such as SOI (Silicon On Insulator) substrate or SOS (Silicon On Sapphire) substrate, etc. can be used.

Furthermore, according to the present embodiment, the source and the drain (the diffusion region 14) included in each of the fin-type FETs are electrically isolated in the same layer, however, the present invention is not limited to the above present embodiment, and the sources and the drains of a plural of fin-type FETs can be unified in the same layer.

Additionally, according to the present embodiment, the via contact 18 is configured to be connected directly on the diffusion region 14, however, the present invention is not limited to the above embodiment, and a pad can be configured to be withdrawn from the diffusion region 14 and be connected by the via contact 18.

Furthermore, according to the present embodiment, the case where the fin has two different heights is taken as an example, however, the present invention is not limited to the above embodiment, and the fin can has more than three different heights.

Second Embodiment

Secondly, the second embodiment of the present invention will be explained in details, referring to the drawings. In the following explanations, the elements identical to ones in the first embodiment are given the same numerals and the detailed explanations of the above elements will be omitted. In addition, the element not specially described is the same as in the first embodiment. FIG. 4 (*a*) is a top view showing a general configuration of the semiconductor device 2 according to the present embodiment. FIG. 4 (*b*) is a C-C cross section of FIG. 4 (*a*). FIG. 4 (*c*) is a D-D cross section of FIG. 4 (*a*). In the present embodiment, a semiconductor device 2 having fin-type FETS formed therein will be explained as an example.

General Configuration:

As shown from FIG. 4 (*a*) to FIG. 4 (*c*), a semiconductor device 2 according to the present embodiment is configured to include an SOI substrate 21 (semiconductor substrate) having a support substrate 21*a*, a buried oxide film 21*b*, and a silicon thin film 21*c* (a second semiconductor film), a fin 22*a* (a first projecting region) formed on the silicon thin film 21*c* (the second semiconductor film) of the SOI substrate 21 (semiconductor substrate) and having a first height, a gate insulating film 15 (a first gate insulating film) formed on an upper face to a side face of the fin 22*a* (the first projecting region), a gate electrode 16 (a second gate electrode) formed on the gate insulating film 15 (the first gate insulating film), a couple of diffusion region regions 14 (a first diffusion region) formed in two regions straddling a region underneath a gate electrode 16 (the first gate electrode) of the fin 22*a* (the first projecting region), a fin 22*b* (a second projecting region) formed on the silicon thin film 21*c* (the second semiconductor film) of the SOI substrate 21 (semiconductor substrate) and having a second height lower than the first height, a gate insulating film 15 (a second insulating film) formed on from an upper face to side face of the fin 22*b* (the second projecting region), a gate electrode 16 (a second gate electrode), and a couple of diffusion regions 14 (a second diffusion region) formed in two regions straddling a region underneath the gate electrode 16 (the second gate electrode) of the fin 22*b* (the second projecting region).

The couple of diffusion regions 14 formed in each of the fin 12*a* and the fin 12*b* are a source and a drain.

In other words, the semiconductor device 2 according to the present embodiment has the same configuration as the first embodiment except that the semiconductor substrate 11 is replaced by the SOI substrate 21 and the fin 12*a* and the fin 12*b* are replaced by the fin 22*a* and the fin 22*b*.

At the same time, as shown in FIG. 4(*a*), each of the diffusion regions 14 is electrically connected to a via contact 18, and is connected to interconnections, etc. not shown in the drawings, through the above via contact 18. To clarify the drawings, the via contacts 18 are omitted in FIG. 4(*b*) and FIG. 4(*c*).

Manufacturing Method:

Secondly, a manufacturing method for the semiconductor device 2 having the above mentioned configuration will be explained using the drawings as below. FIG. 5(*a*) FIG. 5(*b*), FIG. 6(*a*), and FIG. 6(*b*) are process diagrams showing a manufacturing method for the semiconductor device 2 according to the present embodiment. Since processes for forming the gate insulating film 15, the gate electrode 16, the diffusion region 14, and the interlayer insulating films and interconnections not shown in the drawings (including the via contact 18) are the same as the processes explained in the present embodiment by using FIG. 3(*a*) and FIG. 3(*b*), the detailed explanation is omitted herein.

In the present manufacturing method, an SOI substrate 21 is prepared, first. The thickness of the silicon thin film 21*c* of the SOI substrate 21 can be around 50 nm. Secondly, an element isolation insulation film (not shown in the drawings) is formed on the upper face of the silicon thin film 21*c* by LOCOS (Local Oxidation of Silicon) method or STI (Shallow Trench Isolation) method, etc. Consequently, the silicon thin film 21*c* is sectionalized into a plurality of element forming regions by element isolation films. The region having the element isolation insulating film formed therein is referred to as an element isolation region, too.

Subsequently, a photo resist R11 is formed on the silicon thin film 21*c* by the existing photolithography technology. The photo resist R11 is formed on a region of having the fins 12*a* and 12*b* formed therein by the process described as below, on the upper face of the SOI substrate 21.

Subsequently, the fin 22A (a third projecting region) and the fin 22*b* are formed on the buried oxide film 21*b* by etching the silicon thin film 21*c* to the extent of exposing the buried oxide film 21*b* using the photo resist R11 as a mask, as shown in FIG. 5(*a*). The heights of the fins 22A and 22*b* can be around 50 nm. For engraving the silicon thin film 21*c* it is preferable to use an etching technology, such as REI, etc., having capability of engraving approximately vertically to the surface of the substrate and achieving an sufficient selection ratio to the buried oxide film 21*b* of the silicon oxide film.

Subsequently, the photo-resist R11 used as the mask is removed. Secondly, a given impurity ion (for example, Boron ion) is implanted into the fin 22A and the fin 22*b* by the existing ion implantation technology. By the above process, as shown in FIG. 5(*b*), a body region 13 having the adjusted threshold voltage is formed in the fin 22A and the fin 22*b*, respectively. The impurity density of the body region 13 can be around $1$-$3\times10^{18}$/cm$^3$ in the above process.

Subsequently, the silicon oxide film 201 is applied burying the fins 22A and 22*b* in the whole upper face of the SOI substrate 21 and having the required thickness from the upper face of fins 22A and 22*b* using CVD methods. The above required thickness is around the same thickness as the silicon film formed on the fin 22A (corresponding to the fin 22C as explained below). Secondly, as shown FIG. 6 (*a*), an opening 201*a* is formed in the silicon oxide film 201 to expose the upper face of the fin 22A by the existing photolithography technology and the etching technology. For engraving the silicon film 201, it is preferable to use an etching technology, such as REI, etc., having the capability to engrave approximately vertically to the surface of the substrate and achieve a sufficient selection ratio to the fin 22*b* of the silicon film.

Subsequently, silicon is epitaxial-grown on the fin 22A using the fin 22A exposed from the opening 201*a* as a seed layer. By the above process, the fin 22C (the first semiconductor film) is formed on the fin 22A, and consequently the fin 22*a* having a higher height than the fin 22*b* is formed. The thickness of the fin 22C can be around 100 nm.

Although epitaxial growing method technology using the fin 22A as a seed is used for forming the fin 22A, the present invention is not limited to the above present embodiment, and the fin 22C can be formed by depositing silicon in the opening 201a using, for example, a CVD method. In the above case, the silicon film formed on the silicon oxide film 201 is removed by etch back or CMP (Chemical and Mechanical Polishing). Furthermore, the fin 22C formed on the fin 22A, as well as the fin 22A, is monocrystallized by being modified by laser annealing, after the silicon oxide film 201 is removed.

As explained before, according to the present embodiment, the height differential between each of the heights of the fins is formed by stacking a plural of layers (corresponds to one layer in the present embodiment) of a silicon layer (corresponds to the fin 22C in the present embodiment) on the fin (corresponds to the fin 22A in the present embodiment) formed by engraving the silicon thin film 21c of the SOI substrate 21.

Figure 6B:
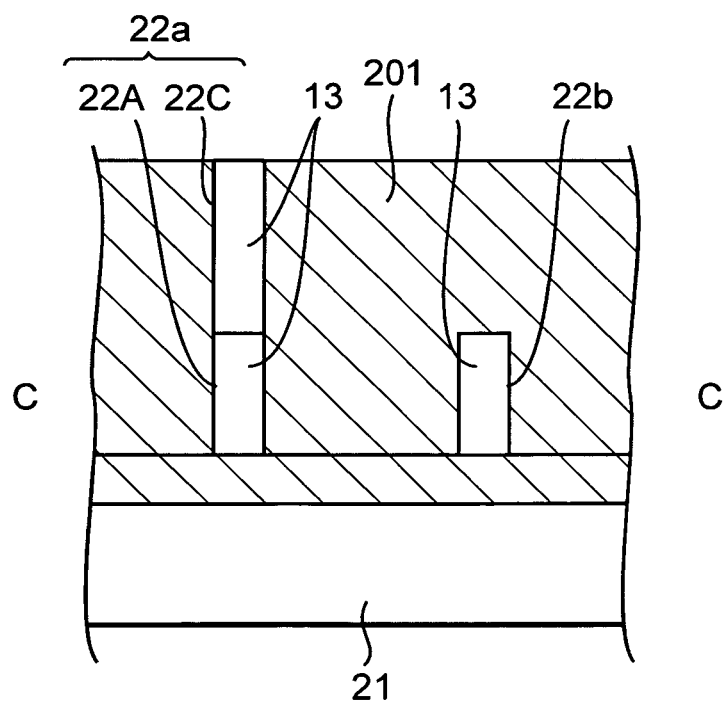

Subsequently, a given impurity ion (for example, Boron ion) is implanted into the fin 22C additionally formed by the existing ion implantation technology, leaving the silicon oxide film 201. By the above process, as shown in FIG. 6(b), a body region 13 having the adjusted threshold voltage is formed in the fin 22C, and consequently, the fins 22A and the fin 22C are electrically connected to each other. The impurity density of the body region 13 can be around $1-3\times10^{18}/cm^3$ in the above process.

Figure 4A:
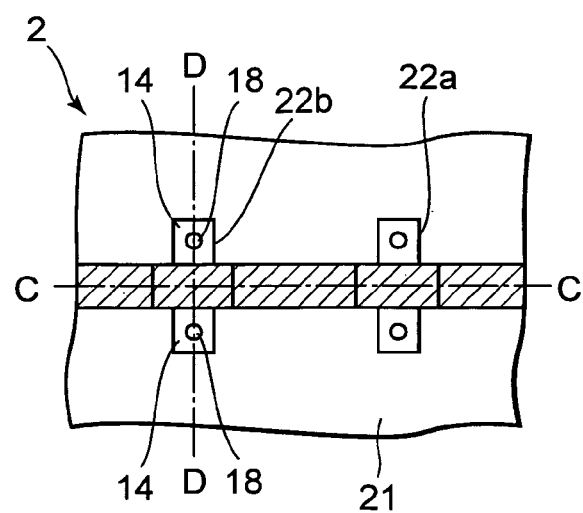
Figure 4B:
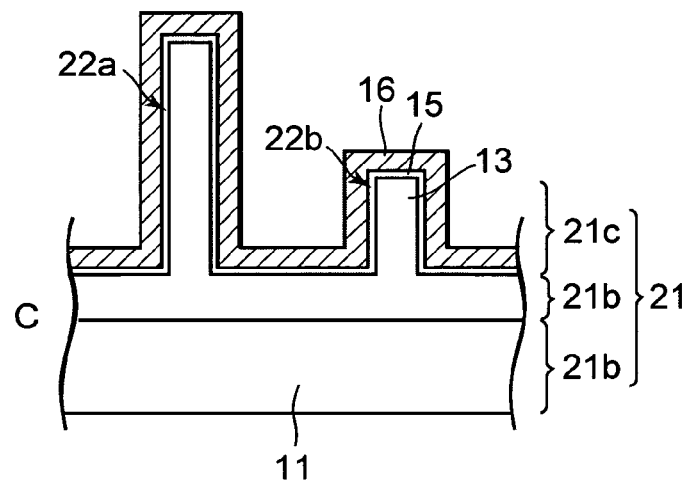
Figure 4C:
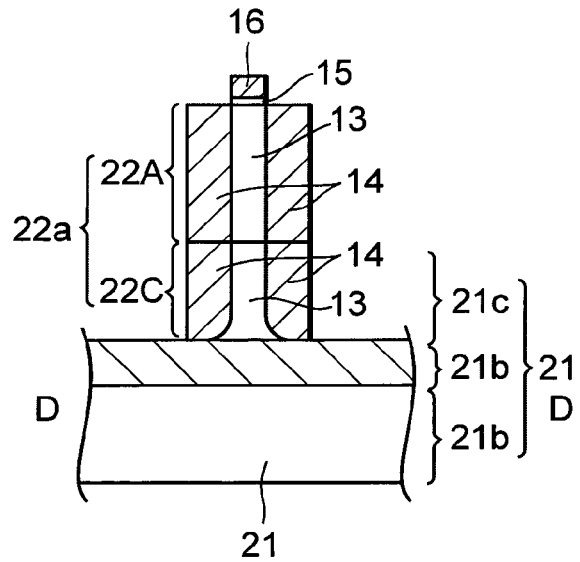

Subsequently, as in the first embodiment, the semiconductor device 2 having the configurations shown in from FIG. 4(a) to FIG. 4(c) is formed by removing the silicon oxide film 201 used as the mask is removed and forming the gate insulating film 15, the gate electrode 16, the diffusion region 14, and inter layer insulating films and inter connection layers, including the via contact 18.

As explained before, the manufacturing method for the semiconductor device 2 according to the second embodiment is configured to include a process for forming the fin 22a (the first projecting region) having the first height and the fin 22b (the second projecting region) having the second height lower than the first height on the silicon thin film 21c of the SOI substrate 21 (the semiconductor substrate), a process for forming the silicon oxide film (the first insulating film) on the upper face and the side face of each of the fin 22a and the fin 22b (the first and the second projecting regions), a process for forming conductive poly silicon film (electric conductor film) on the silicon oxide film (the first insulating film), a process for forming the gate insulating film 15 and the gate electrode 16 on from the upper face and the side face of each of the fin 22a and the fin 22b (the first and the second projecting regions) by patterning the silicon oxide film (the first insulating film) and the poly silicon film (the electric conductor film), and a process for forming a couple of diffusion regions 14 in two regions straddling the region underneath the gate electrode 16 in each of the fin 22a and the fin 22b (the first and the second projecting regions).

In addition, in the above mentioned processes, the process for forming the fins 22a and 22b (the first and the second projecting regions) includes a process for forming the fin 22b (the second projecting region) having the second height and the fin 22A (the third projecting region) by engraving the upper face of the silicon thin film 21c of the SOI substrate 21 (semiconductor substrate) using etching, a process for forming the silicon oxide thin film 201 (the second insulating film) on the upper face of the SOI substrate 21 (semiconductor substrate); the silicon oxide thin film 201 having the film thickness from the upper face of the fin 22A (the third projecting region) larger than the differential between the above first height and the above second height, a process for forming the opening 201a to expose the upper face of the fin 22A (the third projecting region) from the silicon oxide film 201 (the second insulating film), a process for the fin 22a (the first projecting region) by forming the fin 22C (the first semiconductor film) in the opening 201a; the fin 22C having the film thickness same as the differential between the above first height and the above second height, and a process for removing the silicon oxide film 201 (the second insulating film).

According to the second embodiment, the aforementioned configuration enables more than two types of fins differing in the height to be formed. Consequently, it becomes possible to form a plurality of types of fin-type FET differing in transistor-characteristics such as current-voltage characteristics, etc. on the same substrate. In the case where the height of the fin-type FET is formed to be higher than others (corresponding to the fin 22a according to the present embodiment), the effective gate width of the fin-type FET using the above fin becomes larger. Consequently, it becomes possible that the above fin-type FET has a larger current characteristic. Meanwhile, in the case where the height of the fin-type FET is formed to be smaller than others (corresponding to the fin 22b according to the present embodiment), the effective gate width of the fin-type FET using the above fin becomes smaller. Consequently, it becomes possible that the above fin-type FET has a smaller current characteristic.

Additionally, according to the present embodiment, the gate width of each of the fin-type FETs can be controlled by varying the height of the fin. Therefore, even in the case where a plural of fin-types of FET having different transistor characteristics each other is formed on the same substrate, it becomes possible to unify the two-dimensional pattern designs of element-forming region between each of the fin-type FETs. In other words, it becomes possible to use the same two-dimensional pattern design of element-forming region between the fin-type FETs having different transistor characteristics each other. Consequently, the workload on designing circuit patterns can be reduced to a large extent.

As explained before, according to the present embodiment, it becomes possible to change the design of the gate width limited by the height of the fin, correspondingly to the applications, and then, it becomes possible to apply the fin-type FET to already-designed circuits, and to design circuits having various element dimensions by using the fin-type fin.

In addition, although a SOI substrate is used as the semiconductor substrate 2 according to the present embodiment, various types of substrates such as a semiconductor bulk substrate or SOS substrate, etc. can be used.

Furthermore, according to the present embodiment, the source and the drain (the diffusion region 14) included in each of the fin-type FETs are electrically isolated in the same layer, however, the present invention is not limited to the above present embodiment, and the sources and the drains of a plural of fin-type FETs can be unified in the same layer.

Additionally, according to the present embodiment, the via contact 18 is configured to be connected directly on the diffusion region 14, however, the present invention is not limited to the above embodiment, and a pad can be configured to be withdrawn from the diffusion region 14 and be connected by the via contact 18.

Furthermore, according to the present embodiment, the case where the fin has two different heights is taken as an example, however, the present invention is not limited to the above embodiment, and the fin can has more than three different heights. In addition, according to the present embodiment, the case where one layer of semiconductor film (the fin 22C) is formed by engraving the silicon thin film 21c of the SOI substrate 21 is taken as an example, however, the present invention is not limited to the above configuration and a multi-layer semiconductor film can be formed.

The above first or second embodiments is only one of the embodiments of the present invention, and the present invention is not limited to the above embodiments, and then it is obvious that the various modifications of the above embodiments are within the scope of the present invention, and furthermore other embodiment is possible within the scope of the present invention, according to the above description.

What is claimed is:

1. A semiconductor device manufacturing method, comprising;

forming, from a semiconductor substrate, a first projecting region having a first height and a second projecting region having a second height lower than said first height, said first projecting region being separated from said second projecting region by a space;

forming a first insulating film on the upper and side faces of each of said first and second projecting regions;

forming a conductive film on said first insulating film;

forming a gate insulating film and a gate electrode on the upper face and the side faces of each of said first and second projecting regions by patterning said first insulating film and said conductive film, the gate electrode extending continuously, from one of the side faces of said first projecting region, to the upper face of said first projecting region, to the other side face of said first projecting region, across the space separating the first projecting region from said second projecting region, to one of the side faces of said second projecting region, to the upper face of said second projecting region, and to the other side face of said second projecting region, respectively; and forming a couple of diffusion regions in two regions straddling a region underneath said gate electrode of each of said first and second projecting regions.

2. The semiconductor device manufacturing method according to claim 1, wherein said forming said first and second projecting regions includes:

forming said first projecting region having said first height and a third projecting region by engraving an upper face of said semiconductor substrate using etching, and processing said third projecting region to be said second projecting region having said second height by etching said third projecting region from its upper face.

3. The semiconductor device manufacturing method according to claim 1, wherein said forming said first and second projecting regions includes:

forming said second projecting region and a third projecting region by engraving an upper face of said semiconductor substrate using etching, forming a second insulating film on the upper face of said semiconductor substrate, said second insulating film having a thickness from an upper face of said third projecting region that is larger than a differential between said first height and said second height, forming an opening in said second insulating film to expose the upper face of said third projecting region from said second insulating film, forming said first projecting region by forming a first semiconductor film having the same thickness as said differential between said first height and said second height in said opening, and removing said second insulating film.

4. The semiconductor device manufacturing method according to claim 3, wherein said forming said first semiconductor film in said opening includes epitaxial growing said first semiconductor film using said third projecting region being exposed from the bottom of said opening as a seed.

5. The semiconductor device manufacturing method according to claim 3, wherein said forming said first semiconductor film in said opening includes depositing a semiconductor substance on said second insulating film and in said opening, and removing said first semiconductor film formed on said second insulating film.

6. The semiconductor device manufacturing method according to claim 1, wherein said semiconductor substrate is a bulk substrate.

7. The semiconductor device manufacturing method according to claim 1, wherein said semiconductor substrate is an SOI substrate including a support substrate, a oxide film on said support substrate, and a second semiconductor film on said oxide film, and at least a part of said first projecting region and said second projecting region is formed by engraving said second semiconductor film.

8. The semiconductor device manufacturing method according to claim 1, wherein the first insulating film is a silicon oxide film.

9. The semiconductor device manufacturing method according to claim 1, wherein the conductive film is a conductive polysilicon film.

10. The semiconductor device manufacturing method according to claim 1, wherein the gate electrode does not cover said diffusion regions.

11. The semiconductor device manufacturing method according to claim 1, wherein the diffusion regions of each projecting region are disposed on opposite first and second side faces of the respective projecting regions, and the gate electrode is disposed on respective third and fourth side faces of the respective projecting regions, the first and second side faces facing in a direction perpendicular to a direction in which the third and fourth side faces face.

* * * * *